US007235462B2

(12) United States Patent
Letertre et al.

(10) Patent No.: US 7,235,462 B2
(45) Date of Patent: *Jun. 26, 2007

(54) METHODS FOR FABRICATING A SUBSTRATE

(75) Inventors: Fabrice Letertre, Grenoble (FR); Bruno Ghyselen, Seyssinet (FR)

(73) Assignee: S.O.I.Tec Silicon on Insulator Technologies, Bernin (FR)

(*) Notice: Subject to any disclaimer, the term of this patent is extended or adjusted under 35 U.S.C. 154(b) by 347 days.

This patent is subject to a terminal disclaimer.

(21) Appl. No.: 10/922,997

(22) Filed: Aug. 23, 2004

(65) Prior Publication Data

US 2005/0026394 A1 Feb. 3, 2005

Related U.S. Application Data

(63) Continuation of application No. 10/446,605, filed on May 27, 2003, which is a continuation of application No. PCT/FR01/03714, filed on Nov. 26, 2000, now Pat. No. 6,794,276.

(30) Foreign Application Priority Data

Nov. 27, 2000 (FR) .................................. 00 15279

(51) Int. Cl.
*H01L 21/30* (2006.01)
*H01L 21/46* (2006.01)
(52) U.S. Cl. ..................... 438/455; 438/457; 438/458; 438/459
(58) Field of Classification Search ..................... None
See application file for complete search history.

(56) References Cited

U.S. PATENT DOCUMENTS 5,374,564 A 12/1994 Bruel ........................ 437/24

(Continued)

FOREIGN PATENT DOCUMENTS

FR 2 681 472 A1 3/1993

(Continued)

OTHER PUBLICATIONS

Hobart et al., "Transfer of Ultrathin Silicon Layers to Polycrystalline SiC Substrates for the Growth of 3C-SiC Epitaxial Films", Journal of the Electrochemical Society, vol. 146, No. 10, pp. 3833-3836 (1999).

(Continued)

*Primary Examiner*—M. Wilczewski
*Assistant Examiner*—Khanh Duong
(74) *Attorney, Agent, or Firm*—Winston & Strawn LLP

(57) ABSTRACT

A method is provided for fabricating a substrate for optics, electronics, or opto-electronics. This method includes the steps of implanting atomic species into a face of a source substrate to form a weakened zone therein corresponding to the depth of penetration of the atomic species; transferring the seed layer on to a support substrate by bonding a face of the support substrate to the face of the source substrate and detaching the seed layer from the source substrate; depositing a working layer on the seed layer to form a composite substrate comprising the support substrate, seed layer and working layer; and detaching the seed layer and the working layer from the support substrate to form a substrate. Advantageously, the support substrate comprises a material having a thermal expansion value of about 0.7 to 3 times the coefficient value of the working layer, and the seed layer includes a crystal lattice parameter sufficient for the epitaxial growth of the working layer onto the seed layer such that the working layer has a dislocation concentration of less than about $10^7/cm^2$.

22 Claims, 4 Drawing Sheets

U.S. PATENT DOCUMENTS

| | | | |
|---|---|---|---|
| 5,869,387 A * | 2/1999 | Sato et al. | 438/459 |
| 5,877,070 A | 3/1999 | Goesele et al. | 438/458 |
| 5,880,491 A | 3/1999 | Soref et al. | 257/190 |
| 5,953,622 A * | 9/1999 | Lee et al. | 438/458 |
| 6,114,188 A | 9/2000 | Oliver et al. | 438/107 |
| 6,251,754 B1 | 6/2001 | Ohshima et al. | 438/506 |
| 6,303,468 B1 | 10/2001 | Aspar et al. | 438/455 |
| 6,328,796 B1 | 12/2001 | Kub et al. | 117/94 |
| 6,426,270 B1 * | 7/2002 | Sakaguchi et al. | 438/406 |
| 6,534,382 B1 * | 3/2003 | Sakaguchi et al. | 438/455 |
| 6,794,276 B2 * | 9/2004 | Letertre et al. | 438/506 |
| 6,867,067 B2 * | 3/2005 | Ghyselen et al. | 438/107 |

FOREIGN PATENT DOCUMENTS

| | | |
|---|---|---|
| FR | 2 787 919 A1 | 6/2000 |
| WO | WO 00/44966 A1 | 8/2000 |

OTHER PUBLICATIONS

M. Bruel, "Silicon On Insulator Material Technology", Electronics Letters, vol. 31, No. 14, pp. 1201-1202 (1996).

A.J. Steckl et al., "Growth and Characterization of GaN thin Films on SiC SOI Substrates", Journal of Electronic Materials, vol. 26, No. 3, pp. 217-223 (1997).

* cited by examiner

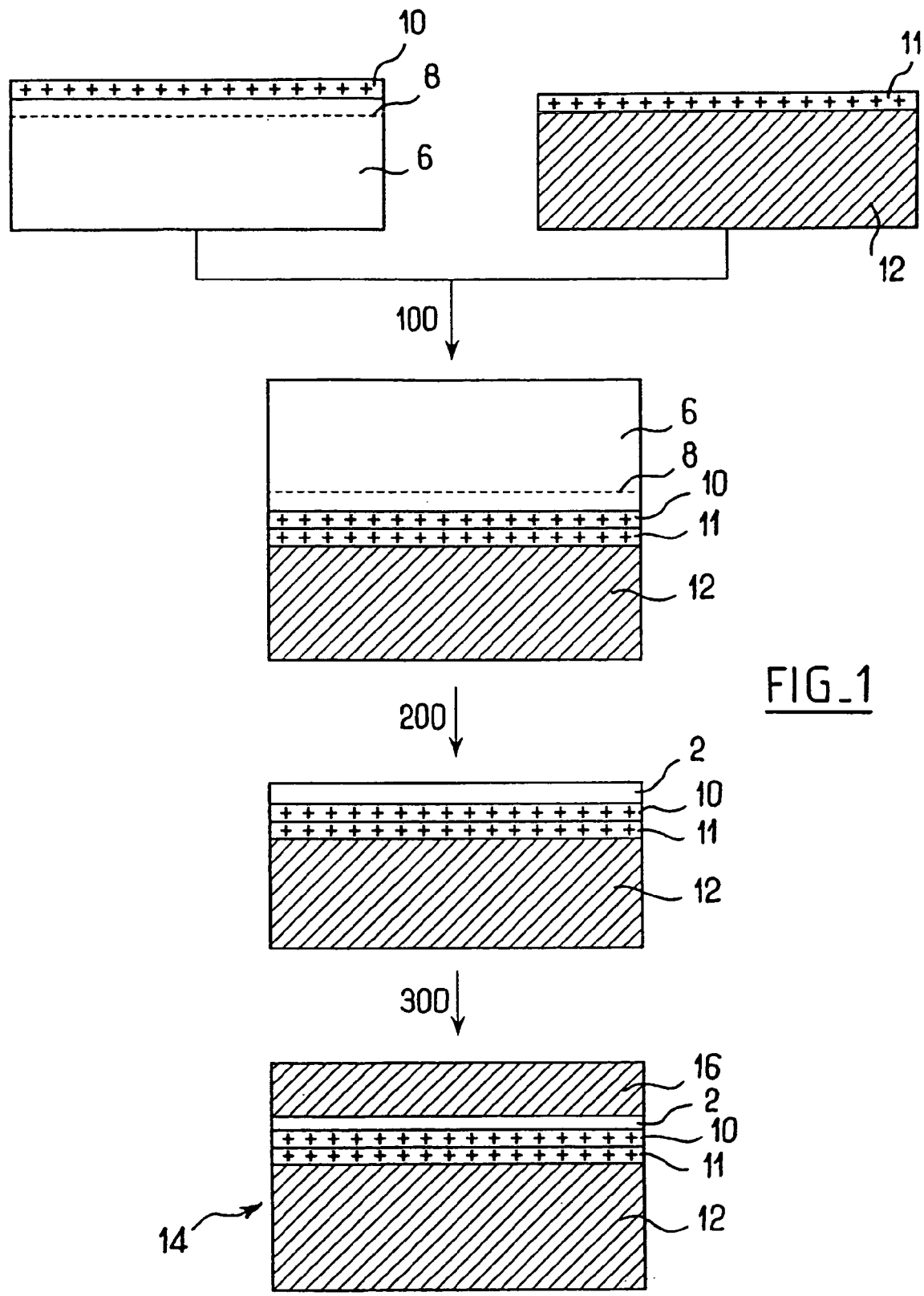
FIG_1

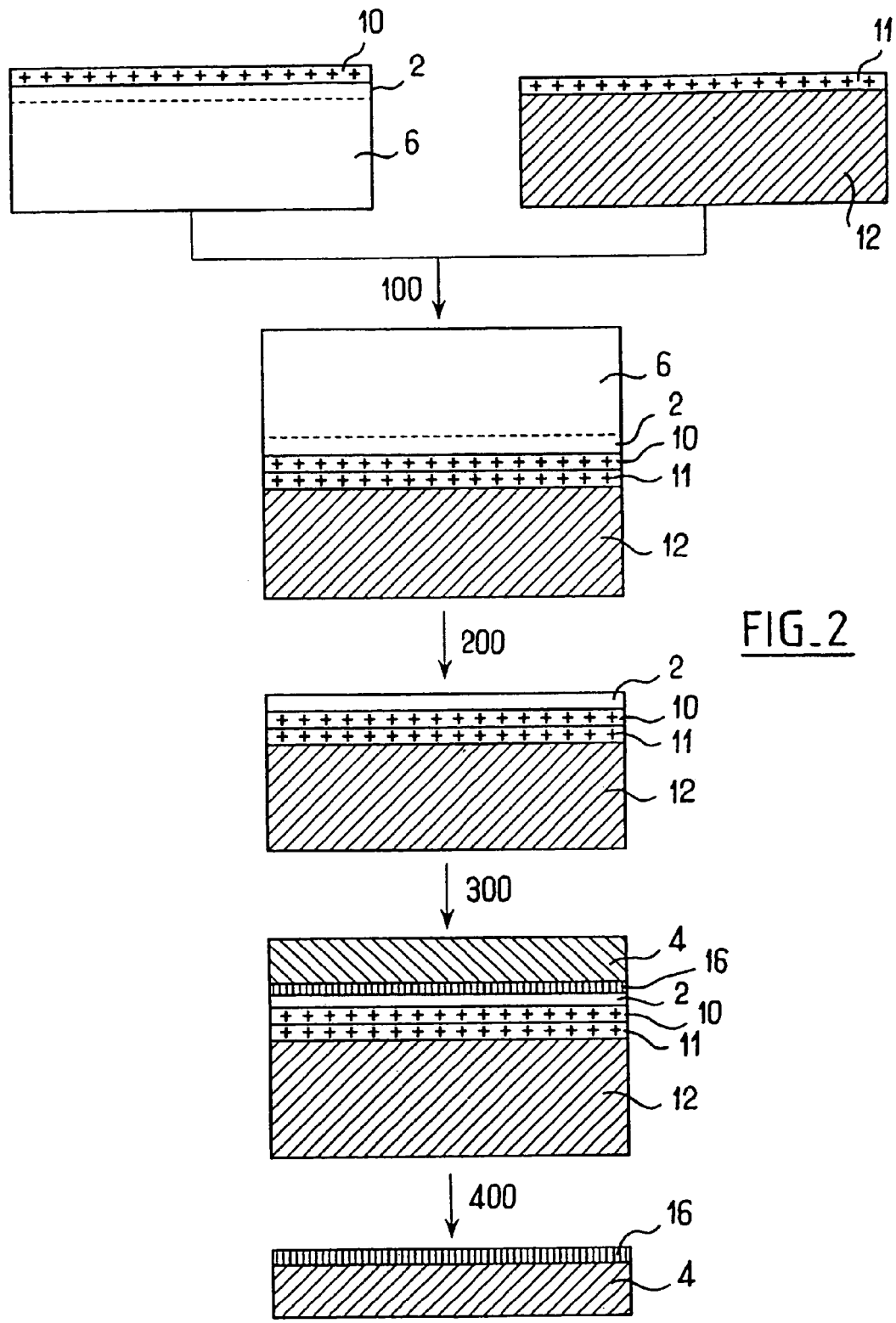
FIG_2

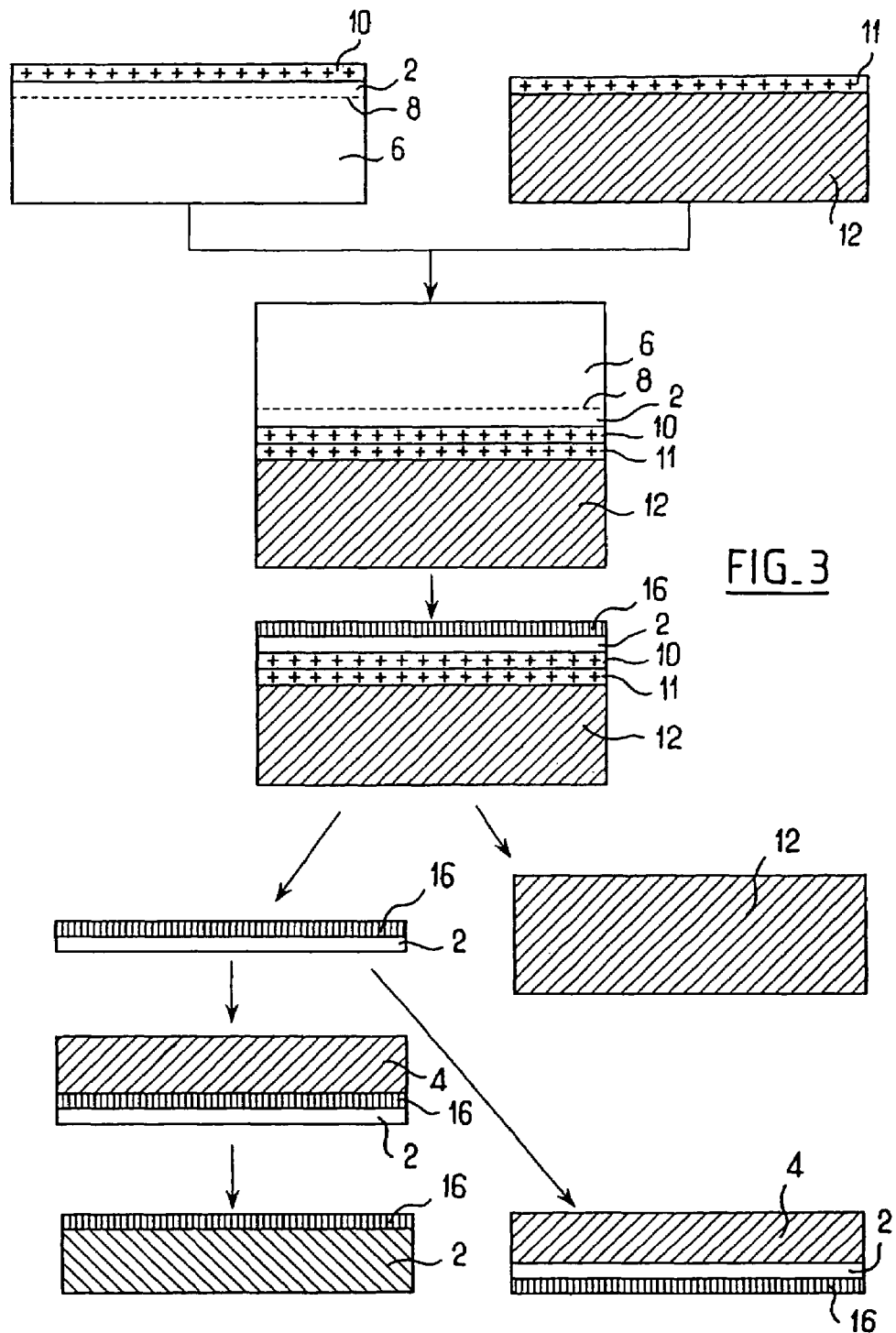
FIG_3

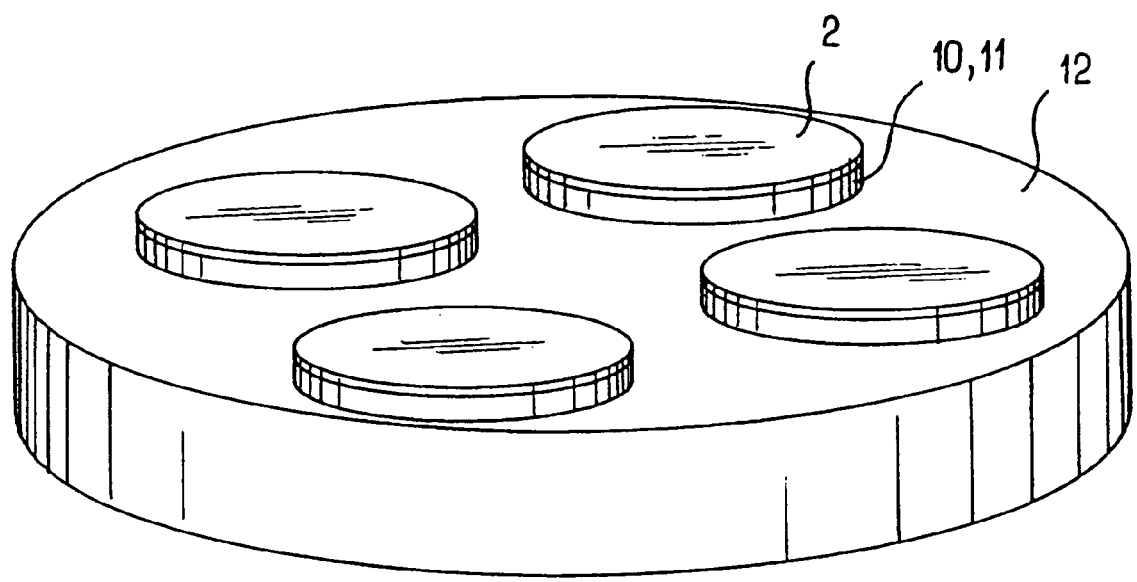
FIG_4

METHODS FOR FABRICATING A SUBSTRATE

CROSS REFERENCE TO RELATED APPLICATIONS

This application is a continuation of application Ser. No. 10/446,605 filed May 27, 2003, which is a continuation of International Application PCT/FR01/03714 filed Nov. 26, 2000, the entire content of each of which is expressly incorporated herein by reference thereto.

FIELD OF THE INVENTION

The invention relates to methods for fabricating substrates, in particular for optics, electronics, or optoelectronics, and also to substrates obtained by such methods. More particularly, the substrates are also suitable for use in fabricating light-emitting and laser diodes.

BACKGROUND OF THE INVENTION

In the technology field of optics, electronics, and optoelectronics, it is often desirable to obtain substrates that comprise a working layer. Two types of methods are currently known for making such substrates. One method includes transferring a working layer from a source substrate onto a support substrate. The other method includes depositing a working layer onto a support substrate by deposition techniques such as molecular beam epitaxy (MBE), metal organic chemical vapor deposition (MOVCD), and the like.

Source substrate materials from which a working layer can be transferred, however, are very difficult to obtain or are otherwise not available. This applies in particular to monocrystalline gallium nitride, which is not available in the form of a solid single crystal of quality, nor is it available with a diameter that is satisfactory, and not available at a reasonable price. Consequently, monocrystalline gallium nitride is typically grown only by a heteroepitaxial technique.

Furthermore, growth of a working layer on a substrate by deposition techniques is not yet satisfactory. There are known techniques for growing a working layer on a seed layer itself carried by a support, in which there is often a need to remove the support substrate in order to obtain the final product. Although techniques for removing the support are known, there are drawbacks. For example, FR 2,787,919A, which is incorporated herein by reference thereto, describes eliminating such a substrate by a mechano-chemical thinning technique. However, all techniques of removing the support by etching or some equivalent technique are undesirable since they lead to significant losses of material, which oftentimes is expensive. U.S. Pat. No. 6,114,188, incorporated herein by reference, also describes a technique for separating a complex transition metal oxide (CTMO) film made by deposition, in which a special treatment is performed on the native substrate from which the film is to be grown, and then the deposited film is detached from the native substrate. Nevertheless, that technique is also undesirable since it runs the risk of compromising proper initiation of film growth and thus leads to either a loss of yield or to a deposited layer of poor quality.

Additionally, it is known that sapphire, silicon carbide and {111} silicon can be used as seed substrates for the deposition of gallium nitride by heteroepitaxy. However, sapphire is an electrical insulator, which is a disadvantage in certain applications, and monocrystalline silicon carbide presents the drawbacks of being expensive and difficult to obtain in large diameters. Furthermore, as sapphire is an electrical insulator, if it is retained in the form of a solid support, then it becomes necessary for any electrodes needed for the intended application of the working layer to be provided solely on the working layer itself, which can give rise to problems of available space (for example, if two electrical contacts are to be made on a front face, i.e. on the free surface of the working layer).

In prior art techniques, monocrystalline silicon carbide or sapphire were used to serve both as a support and as a growth seed for the working layer. One drawback from such prior art techniques exists when the working layer is used to form light-emitting diodes (LEDs), using a solid silicon carbide or sapphire support means, namely, that it is not possible to satisfactorily control the positions of electrical contacts, the extraction of the light emitted by the diode, or the use of a reflecting surface, etc Although {111} silicon may be ideal for use as a substrate due to its very widespread use, the fact that it is inexpensive and available in large diameters, problems have arisen during attempts to deposit gallium nitride on {111} silicon using the standard technique of MOCVD at about 1000° C. to 1100° C. Such problems include dislocations forming in he thin layer of gallium nitride at a concentration in excess of $10^8$ per square centimeter ($cm^2$). Moreover, if {111} silicon is used as a support, i.e. in thick form, then cracking is observed in the working layer because of poor matching in terms of thermal expansion.

In other prior art techniques, attempts have been made to deposit gallium nitride directly on solid gallium nitride or indeed on neodymium gallate or on indium gallate. However, solid gallium nitride is expensive and those techniques are not mature.

Thus, improvements in such methods for fabricating a substrate are desired. Also needed is a method that overcomes the difficulties associated with substrate materials. Certain new and useful improved methods are provided by the present invention.

SUMMARY OF THE INVENTION

The invention provides new ways for fabricating substrates for use in the fields of optics, electronics, or optoelectronics. In particular, in accordance with the invention a method is provided for fabricating a substrate which generally comprises implanting atomic species into a face of a source substrate to form a weakened zone therein corresponding to the depth of penetration of the atomic species; transferring the seed layer on to a support substrate by bonding a face of the support substrate to the face of the source substrate and detaching the seed layer from the source substrate; depositing a working layer on the seed layer to form a composite substrate comprising the support substrate, seed layer and working layer; and detaching the seed layer and the working layer from the support substrate to form a substrate.

Preferably, the support substrate comprises a material having a thermal expansion value of about 0.7 to 3 times the coefficient value of the working layer, and the seed layer includes a crystal lattice parameter sufficient for the epitaxial growth of the working layer onto the seed layer such that the working layer has a dislocation concentration of less than about $10^7/cm^2$.

Generally, the material between the face of the substrate and the weakened zone defines the seed layer. The seed layer is preferably adhered to the support substrate by molecular adhesion in an adhesion interface. The method further comprises detaching the seed layer and the working layer from the composite substrate by the application of stress at the adhesion interface, wherein the stress is selected from the group consisting of mechanical stress, thermal stress, chemical etching, electrostatic stress and laser irradiation stress, or any combination thereof. Also, working layer can be deposited on the seed layer by chemical vapor deposition, high temperature chemical vapor deposition, hydride vapor phase epitaxy, epitaxy, metal organic chemical vapor deposition, or molecular beam epitaxy.

The seed layer preferably comprises a material from the group consisting of sapphire, silicon carbide, zinc oxide, silicon, gallium nitride, neodymium gallate, and lithium gallate, and the working layer is gallium nitride. Also, the support substrate preferably comprises a material from the group consisting of silicon carbide, aluminum nitride, silicon, and sapphire. In an advantageous embodiment, the seed layer and the support substrate have substantially the same composition.

The method further comprises applying at least one intermediate layer between the seed layer and the support substrate. This intermediate layer can be a bonding layer or an insulating layer. Preferably, one intermediate layer is present upon the seed layer prior to transfer and forms the face of the source substrate that is bonded to the support substrate, while another intermediate layer forms the face of the support substrate that is bonded to the face of the source substrate. In this embodiment, the support substrate may be polycrystalline SiC, monocrystalline SiC, sapphire, polycrystalline AlN or polycrystalline GaN, the seed layer may be Si, monocrystalline SiC, sapphire, monocrystalline GaN, $NdGaO_2$, or $LaGaO_2$, each bonding layer may be $SiO_2$ or $Si_3N_4$, and the working layer may be GaN, AlN, AlGaN, GaInN, or SiC.

The method also can include applying a further layer upon the working layer on a face opposite that of the seed layer, wherein the further layer is polycrystalline SiC, polycrystalline AlN, polycrystalline GaN, boron nitride, diamond or a metal.

BRIEF DESCRIPTION OF THE DRAWING FIGURES

Other aspects, objects, and advantages of the invention will appear on reading the following detailed description, and the invention will also be better understood with the help of the accompanying drawings.

FIG. 1 is a diagram showing the steps in an implementation of the method in accordance with the invention;

FIG. 2 is a diagram of the steps in another implementation of the method in accordance with the invention;

FIG. 3 is a diagram of the steps in yet another implementation of the method of the invention; and FIG. 4 is a diagrammatic perspective view of an intermediate support with four seed layers, of the kind that can be used in a variant of the method of the invention.

DETAILED DESCRIPTION OF THE PREFERRED EMBODIMENTS

In accordance with the invention, the method comprises transferring a seed layer onto a support substrate, depositing a working layer on the seed layer to form a composite substrate; and detaching the seed layer and the working layer from the composite substrate.

The seed layer in accordance with the invention may comprise material such as sapphire, silicon carbide, zinc oxide, silicon, gallium nitride, neodymium gallate, lithium gallate, or any combination thereof. Also included are other materials commonly known in the art.

Preferably the seed layer includes a crystal lattice parameter that is sufficient for growing a working layer onto the seed layer that has, wherein the working layer has a dislocation concentration less than about $10^7/cm^2$.

Also in accordance with the invention, the method comprises a source substrate including a seed layer and a weakened zone. In this embodiment, the seed layer is detached from the source substrate at the weakened zone, and transferred onto a support substrate. The detached seed layer is transferred onto the support substrate, for example, by molecular adhesion at an adhesion interface. A working layer is deposited onto the transferred seed layer to form a composite substrate. The seed layer and the working layer are detached from the composite substrate at the adhesion interface.

The depositing step may include depositing the seed layer onto the support substrate by epitaxy. However, other methods as known in the art may be used. The seed layer and the working layer are detached from the composite substrate by the application of stress, for example.

Optionally, the invention may further include applying a first bonding layer onto the source substrate, and applying a second bonding layer onto the support substrate. Preferably, the source substrate includes implanted atomic species to a predetermined depth to form a weakened zone. The first and second bonding layers may be contacted to attach the source and support substrates, and then the seed layer can be detached from the source layer at the weakened zone and then transferred onto the support substrate. Thereafter, the working layer may be deposited onto the seed layer, which has been transferred to the support substrate.

Advantageously, the detaching step, as mentioned above, comprises application of stress, such as mechanical stresses, thermal stresses, electrostatic stresses, laser irradiation stresses, or a combination thereof. Thus, if desired the support may be recycled and reused.

The support substrate preferably comprises a material having a coefficient of thermal expansion of about 0.7 to 3 times the coefficient of the working layer, and the seed layer is suitable for accommodating the thermal expansion of the support and of the working layer. Preferably, the values of the thermal expansion coefficients herein relate to those in a plane parallel to the plane of the working layer. Advantageously, the material selected to form the support presents thermal expansion coefficients that reduce or even eliminate significant tension or compression stresses of the kind that arise during the variations in temperature that are inherent to growing the working layer, or that occur on returning the substrate formed in this way to ambient temperature.

Importantly, tolerance to the differences of the thermal expansion coefficients of the working layer and the support substrate materials, increases when the difference leads to compression in the working layer, as opposed to when it leads to stretching of the layer. Thus, in compression, the thermal expansion coefficient of the support material can be several times greater than that of the working layer. However, in extension, the thermal expansion coefficient of the support material is preferably not less than 0.7 times the coefficient of the working layer.

Preferably, the seed layer is suitable for adapting to the thermal expansions imposed by the support and/or the working layer. For this purpose, the seed layer has a thickness that is small enough to enable it to be deformed so as to accommodate the dimensional variations due to thermal expansion of the support and/or of the working layer. This thickness depends on the material constituting the seed layer and on the respective materials of the support and of the working layer. Typically, for a silicon carbide support having thickness of 300 microns (μm) and a gallium nitride working layer having thickness of several microns, a monocrystalline silicon carbide seed layer should have thickness that is less than 0.5 μm, and that is preferably less than 1000 angstroms (Å).

Advantageously, as mentioned above, the material comprising the seed layer also presents lattice parameters such that the working layer can be grown epitaxially on the seed layer with dislocations in the working layer at a concentration of less than $10^7/cm^2$. The person skilled in the art knows how to perform such epitaxial growth by selecting parameters and orientations both for the seed layer and for the working layer.

In accordance with the invention, the method provides, as shown in FIG. 1, a final substrate 14 comprising a working layer 16 on a seed layer 2. In one embodiment, the method comprises applying a bonding layer 10 on a surface of a source substrate 6, which is subjected to implantation of atomic species. A second bonding layer 11 is preferably applied to a surface of a support 12. The implanted atomic species are implanted to a predetermined depth in the source substrate 6 so that a zone of weakness 8 is formed. The bonding layers are preferably contacted 100. and the seed layer is detached from the source substrate 6 via the zone of weakness 8, and a working layer is deposited 16 on the surface of the seed layer 2 corresponding to the zone of weakness 8. The steps of forming the bonding layer 10 and of implanting the atomic species can be performed in the order specified above or in another order.

As used herein, the term "atomic implantation" is used to cover any bombardment using atomic or ionic species and suitable for introducing these species into a material so as to achieve a concentration maximum of these species in the material, said maximum being situated at a determined depth relative to the bombarded surface. The atomic or ionic species are introduced into the material with energy distributed around a maximum. Atomic species can be implanted in the material using an ion beam implanter, a plasma immersion implanter, etc. The term "atomic or ionic species" is used to mean an atom in ionic, neutral, or molecular form, or molecules in ionic or neutral form, or indeed a combination of different atoms or molecules in ionic or neutral form.

Alternatively, an intermediate layer such as an insulating layer may be applied to form a substrate comprising a semiconductor on insulation. By way of example the intermediate layer can be made of diamond, of fine oxide (500 Å thick), and the like, and may be applied between the working layer 16 and/or the seed layer 2 (if it is conserved) and the support 12, or the thick layer 4 as described below.

The implanting atomic species step and the detaching the seed layer step 200 are now described in U.S. Pat. No. 5,374,564, which is equivalent to French patent No. FR 2,681,472, each of which is incorporated herein by express reference thereto. Those documents generally disclose a process for the preparation of thin semiconductor material films, which comprises subjecting a semiconductor material wafer having a planar face and whose plane is substantially parallel to a principal crystallographic plane to certain processing steps. A first step comprises implanting ions through the face of the wafer to create, in the volume of the wafer at a depth close to the average penetration depth of the ions, a weakened layer that includes gaseous microbubbles defining in the volume of the wafer an upper region constituting the thin film to be transferred. The ions are chosen from among hydrogen gas ions, rare gas ions or mixtures thereof, and the temperature of the wafer during implantation is preferably kept below the temperature at which the gas produced by the implanted ions can escape from the semiconductor by diffusion.

A second step comprises intimately contacting the planar face of the wafer with a stiffener constituted by at least one rigid material layer to form an assembly. A third step includes thermally treating the assembly of the wafer and stiffener at a temperature above that at which the ion bombardment takes place and adequate to create by a crystalline rearrangement effect in the wafer and a pressure effect in the microbubbles, to cause a separation between the thin film and the rest of the wafer. As the stiffener and the planar face of the wafer are kept in intimate contact at this time, the thin layer is transferred from the wafer to the stiffener. The selection of the stiffener is a function of the envisaged application for the transfer layer. For example, if the intended application is the production of a silicon on insulator substrate, the stiffener can advantageously be a silicon wafer covered by at least one dielectric layer, such as an oxide or a nitride layer, with the dielectric layer of the stiffener being intimately in contact with the wafer from which the film is to be transferred. Optionally, the wafer also may have an encapsulating layer of dielectric material, e.g. silicon oxide.

Although this technique is preferred, other commonly known layer transfer methods may also be used. The steps of forming the bonding layers 10 and 11 correspond, by way of example, to forming a layer of amorphous material using any of the methods known to the person skilled in the art.

An optional step of preparing the surface of the seed layer 2 that is to receive the working layer 16 may be performed. Such preparation of the surface include but are not limited to polishing operations, annealing operations, smoothing annealing operations (e.g., under hydrogen), annealing operations for reinforcing the adhesive interface between the bonding layers 10 and 11, sacrificial oxidation operations (oxidation followed by elimination of the oxidized material), etching operations, and the like.

Table 1 below summarizes the lattice parameters and the thermal expansion coefficients of various materials that are suitable for use in implementing the method of the invention, either as a material for the working layer or as a material for the seed layer or as a material for the support substrate. However, these examples are illustrative and should not be construed as limiting the features of the invention.

TABLE 1

|  | GaN (W) | AlN (W) | $Al_2O_3$ (H) | Si (C) | 6H-SiC (W) |
|---|---|---|---|---|---|
| Lattice parameters (Å) | a = 3.189<br>c = 5.185 | a = 3.112<br>c = 4.982 | a = 4.758<br>c = 12.99 | c = 5.430 | a = 3.08<br>c = 15.12 |
| Thermal expansion coefficients along a or c ($\times 10^{-6} K^{-1}$) | 5.59<br>3.17 | 4.15<br>5.27 | 7.5<br>8.5 | 2.6 | 4.20<br>4.68 |
| Thermal conductivity (W/cm.K) | 1.3 | 2.5 | 0.5 | 1.5 | 4.9 |
| Maximum diameter |  |  | 4 | 8 | 2 |

TABLE 1-continued

|  | GaN (W) | AlN (W) | Al$_2$O$_3$ (H) | Si (C) | 6H-SiC (W) |
|---|---|---|---|---|---|
| currently available (inches) |  |  |  |  |  |
| Quality of substrates available |  |  | Excellent | Excellent | Variable |
| Relative prices for 2-inch substrates (arbitrary units) |  |  | 10 | 1 | 125 |

Preferably, the working layer comprises material such as gallium nitride, aluminum nitride, and gallium and aluminum nitride (and in general manner, semi conductive nitrides having a large band gap).

The seed layer preferably comprises materials such as sapphire, silicon carbide, zinc oxide, and {111} silicon. The seed layer may also be selected to obtain a precise crystal structure and orientation, for example to obtain hexagonal or cubic gallium nitride, or if an Si face or a C face is selected to deposit the working layer on a seed layer of silicon carbide; the seed layer is made of gallium nitride of very high quality, i.e. having fewer than $10^6$ dislocations per square centimeter, e.g. gallium nitride obtained by the epitaxial lateral overgrowth (ELOG) technique.

The support substrate material preferably comprises amorphous materials, polycrystalline materials, and sintered materials. More preferably the support comprises materials such as polycrystalline silicon carbide, monocrystalline silicon carbide, polycrystalline aluminum nitride, polycrystalline gallium nitride, and monocrystalline gallium nitride having a high concentration of dislocations (greater than $10^7/cm^2$). The materials for both the seed layer and the support may be have the same chemical composition.

As mentioned above, the seed layer may be dissociated from a source substrate at a weakened zone. In this respect, the seed layer taken from the source substrate may be assembled to the support and then eroded via its free face so as to obtain a seed layer of desired thickness (for this purpose it is possible to use a technique taken from the technique used for obtaining substrates and of the type known in the art as bond and etch back silicon on insulator (BESOI)). The dissociation of the seed layer may be accomplished at least in part by heat treatment, applying mechanical stresses, chemical etching, or a combination of at least two of these operations. Alternatively, other known methods in the art may be used.

Thus, an embodiment of the invention relates to a substrate for optics, electronics, or opto-electronics, which comprises a seed layer of Si, monocrystalline SiC, sapphire, monocrystalline GaN, NdGaO$_2$, or LaGaO$_2$, a bonding layer of SiO$_2$ or Si$_3$N$_4$ on the seed layer, and a working layer of GaN, AlN, AlGaN, GaInN, or SiC on the bonding layer.

Table 2 below summarizes examples of materials that are suitable for use in implementing the methods of the invention described above. These are illustrative and should not be construed as limiting the features of the invention.

TABLE 2

| Working layer 16 | Seed layer 2 (typically 1000 Å thick) | Bonding layers 10, 11 (typically 1 μm thick) | Support 12 (typically 300 μm thick) |
|---|---|---|---|
| GaN or AlN or AlGaN or GaInN or SiC or other | Mono SiC | SiO$_2$ or Si$_3$N$_4$ | Poly SiC or mono SiC or sapphire or poly AlN or poly GaN |
| GaN or AlN or AlGaN or GaInN or SiC or other | {111} Si | SiO$_2$ or Si$_3$N$_4$ | Poly SiC or mono SiC or sapphire or poly AlN or poly GaN |
| GaN or AlN or AlGaN or GaInN or SiC or other | Sapphire | SiO$_2$ or Si$_3$N$_4$ | Poly SiC or mono SiC or sapphire or poly AlN or poly GaN |
| GaN or AlN or AlGaN or GaInN or SiC or other | Mono GaN | SiO$_2$ or Si$_3$N$_4$ | Poly SiC or mono SiC or sapphire or poly AlN or poly GaN |
| GaN or AlN or AlGaN or GaInN or SiC or other | NdGaO$_2$ or LiGaO$_3$ | SiO$_2$ or Si$_3$N$_4$ | Poly SiC or mono SiC or sapphire or poly AlN or poly GaN |

In the above table, as in the tables below, the term "mono" is used to mean "monocrystalline" and the term "poly" is used to mean "polycrystalline".

EXAMPLE 1

In the example corresponding to the first row of Table 2, a working layer 16 is made of gallium nitride on a seed layer 2 constituted by monocrystalline silicon carbide, itself on a polycrystalline silicon carbide support 12, with bonding layers 10 and 11 of silicon carbide being interposed between the support 12 and the seed layer 2. By way of example, the seed layer 2 is 1000 Å thick. The support 12 is 300 μm thick, for example.

The structure comprising a stack of the seed layer 2 of monocrystalline silicon carbide, the two bonding layers 10 and 11 of silicon oxide, and the support 12 of polycrystalline silicon carbide is made by a layer transfer method known to the person skilled in the art (e.g. see an application of the Smart-Cut® method in French patent No FR 2,681,472 or U.S. Pat. No. 5,374,564, each of which is expressly incorporated herein by reference thereto).

The working layer 16 can be made by chemical vapor deposition (CVD), by high temperature chemical vapor deposition (HTCVD), by MOCVD, by MBE, or by hydride vapor phase epitaxy (HVPE), see for example the documents "GaN bulk substrates for GaN-based LEDs and LDs", by O. Oda et al., Phys. Stat. Sol. (a), No. 180, p.51 (2000), or other equivalent techniques.

The use of silicon oxide for the bonding layer 10 makes it easier to take the seed layer 2 from the source substrate 6. The planarized deposit of silicon oxide makes it possible to eliminate surface irregularities and to perform a polishing step, a planarizing step, a cleaning step, a chemical preparation step, and a step of bonding said silicon oxide onto the silicon oxide of the bonding layer 11 formed on the support 12 using conventional techniques that are easy to implement. By way of example, the set of bonding layers 10 and 11 is one micron thick.

EXAMPLE 2

In this example (second row of above table), a structure is provided that is equivalent to that of Example 1, except that the seed layer 2 of silicon carbide is replaced by a seed layer 2 of {111} silicon.

The thickness of the {111} silicon is preferably limited to less than 3000 Å so as to enable it to adapt without cracking to the thermal expansion that will take place during the various operations mentioned above.

EXAMPLE 3

In this example (third row of the above table), a structure is made that is equivalent to that of Examples 1 and 2, except that the seed layer 2 is made of sapphire.

Sapphire is another material that is known for permitting good epitaxy of gallium nitride.

EXAMPLE 4

In this example (fourth row of the above table) a structure is made that is equivalent to that of Examples 1 to 3, except that the seed layer 2 is made of monocrystalline gallium nitride.

EXAMPLE 5

In this example (fifth row of the above table), a structure is made that is equivalent to that of Examples 1 to 4, except that the seed layer 2 is made of neodymium gallate or of lithium gallate.

Numerous variants of the above examples are encompassed by and are in accordance with the present invention. For example, the silicon oxide in one of the bonding layers 10 and 11, or the silicon oxide in both bonding layers 10 and 11 can be substituted by some other material, for example silicon nitride ($Si_3N_4$). This material can withstand higher temperatures than silicon oxide. This advantage is particularly advantageous in the context of optimizing deposition of the working layer 16 in order to form a monocrystalline layer of good quality or indeed when it is desired to increase the rate of deposition. Silicon nitride also has the advantage of limiting or even avoiding diffusion of gallium into the support 12.

In yet another variant of the method of the invention, the working layer 16 of gallium nitride is substituted by a working layer 16 of aluminum nitride, of silicon carbide, an alloy of aluminum and of gallium, and alloy of gallium and indium, or some other compound. The working layer 16 of gallium nitride can also be substituted by a multilayer structure constituting a stack of layers of the gallium nitride, aluminum nitride, gallium and indium nitride, etc. types, possibly having different kinds of doping, etc.

In yet other variants, the polycrystalline silicon carbide support 12 is substituted by monocrystalline silicon carbide (in particular when the support 12 can be recycled as mentioned below), sapphire, polycrystalline aluminum nitride, or polycrystalline gallium nitride.

After growing the working layer 16, the support 12 is removed, possibly after reinforcing the structure as a whole, where necessary for questions of strength, by means of some other support either by direct adhesion, or by forming said other support by depositing it on the working layer, etc.

The support 12 must then be capable not only of withstanding the conditions under which the working layer 16 is grown, but is advantaged by being suitable for removal. The technique selected for withdrawing the intermediate support 12 can determine the material selected for constituting it. If it is to be sacrificed by etching or by mechanical or chemical removal, then the etching and removal steps and also the intermediate support 12 itself must be as low cost as possible. Under such circumstances, the support 12 should be made of polycrystalline aluminum nitride.

In accordance with the invention, stresses such as mechanical, thermal, electrostatic, laser irradiation, etc. are used to cause the composite substrate to split into two portions situated on either side of the adhesion interface. Under such circumstances, the support 12 can be made of monocrystalline silicon carbide since it is not consumed and can be reused.

In another variant, all or some of the components on the working layer 16 are made either before or after removing the support 12.

In another embodiment of the invention, the method of the invention, and as shown in FIG. 2, provides a structure comprising a working layer 16 on a seed layer 2 itself on a support 12 with bonding layers 10 and 11 interposed between the seed layer 2 and the support 12. A thick layer 4 is deposited on the free surface of the working layer 16 and the support 12 is removed, possibly together with the seed layer 2. The thick layer 4 then serves in particular to form a support for the working layer 16, after the support 12 has been removed.

In this embodiment, the further layer of the substrate is present upon the working layer on a face opposite that of the seed layer, wherein the further layer preferably is polycrystalline SiC, polycrystalline AlN, polycrystalline GaN, boron nitride, diamond or a metal such a copper.

Table 3 below summarizes examples of materials that can be used in the context of this second implementation of the method of the invention. These examples are purely illustrative and should not be construed as limiting.

TABLE 3

| Working layer 16 | Seed layer 2 | Bonding layers 10, 11 | Support 12 | Thick layer 4 |
|---|---|---|---|---|
| GaN or AlN or AlGaN or GaInN or SiC or other | {111} Si or mono SiC or GaN or sapphire or $NdGaO_2$ or $LiGa_3$ | $SiO_2$ or $Si_3N_4$ | Poly SiC or poly AlN or sapphire or mono SiC or poly GaN | Diamond or poly SiC or GaN or AlN or boron nitride or metal (copper) |

EXAMPLE 6

A seed layer 2 of monocrystalline {111} silicon is made on a polycrystalline silicon carbide support 12 with silicon oxide bonding layers 10 and 11 between them. Thereafter a working layer 16 of monocrystalline gallium nitride is deposited by MOCVD and a thick layer 4 of diamond is deposited on the free face of the monocrystalline gallium nitride of the working layer 16.

Thereafter the resulting structure is subjected to treatment suitable for detaching the composite substrate constituted by the working layer 16 from the composite substrate constituted by the support 12 and the seed layer 2. This treatment comprises using mechanical, thermal, electrostatic, etc. stresses to cause two portions to become separated on either side of the adhesion interface.

This example presents the advantage of making it possible to use a support 12 whose surface that is to receive the seed layer 2 is poorly finished, but once the working layer 16 of GaN has been formed by virtue of the seed layer 2 of {111} silicon, it is possible to make a final support (the thick layer 4) for the working layer 16 that has properties adapted to using said working layer 16 (in this case, with diamond, it is the good thermal conductivity and electrical insulating properties that are desired, e.g. for microwave applications), and it is also possible to ensure a high quality interface between the thick layer 4 and the working layer 16, e.g. to obtain better heat conduction.

This embodiment may have variants such as the seed layer 2 of {111} silicon can be replaced by monocrystalline silicon carbide, sapphire, neodymium gallate, or lithium gallate; the bonding layers 10 and 11 of silicon oxide can be replaced by silicon nitride; the polycrystalline silicon carbide support 12 can be replaced by monocrystalline silicon carbide or by sapphire; and the thick layer 4 of diamond can be replaced by polycrystalline silicon carbide, by polycrystalline gallium nitride (e.g. deposited by HVPE), by boron nitride, or by a metal such as copper, etc. (e.g. deposited as a thick layer by electrolysis).

The thickness properties of the thick layer 4 can be of importance, for example when it is desired to make electrical contact with the rear face of the final substrate 14 or when it is essential to be able to evacuate the heat generated by components made on the working layer 16, or indeed when it is desired to improve extraction and control of light emitted by a diode or a laser made in the working layer 16. It will then be understood that the properties selected for the thick layer 4 provide a degree of freedom in substrate fabrication methods that is particularly advantageous when making substrates for optics, electronics, optoelectronics, etc. It is also possible to add a degree of freedom in substrate fabrication methods by providing preparation steps (known in themselves to the person skilled in the art) in order to enable the thick layer 4 to be subsequently separated from the working layer 16.

Similarly, these variants can be transposed to situations in which a working layer 16 is made of aluminum nitride, of silicon carbide, an alloy of aluminum and gallium, or of other compounds, instead of making the working layer 16 out of gallium nitride as described above. The gallium nitride working layer 16 can also be a multilayer structure stacking layers of the gallium nitride, aluminum nitride, etc. type, possibly with doping of different kinds, etc.

In yet another embodiment of the invention, as shown in FIG. 3, a structure is made in which the thick layer 4 is deposited after the working layer 16 and the seed layer 2 have been separated, contrary to that which is described above with reference to the second implementation of the invention. The thick layer 4 can then either be deposited on the same side as the free face of the working layer 16 or else it can be deposited on the same side as the seed layer 2, either on said seed layer 2 or on the corresponding face of the working layer 16, if the seed layer 2 is removed either together with the support 12 or after the support 12 has been removed.

Another embodiment of the method of the invention is described below with reference to three examples. The materials used in the context of these three examples are summarized in Table 4, and they correspond to the materials of Table 3.

TABLE 4

| Working layer 16 | Seed layer 2 | Bonding layers 10, 11 | Support 12 | Thick layer 4 |
|---|---|---|---|---|
| GaN or AlN or AlGaN or GaInN or SiC | Mono SiC or {111} Si or sapphire or GaN or NdGaO$_2$ or LiGaO$_3$ | SiO$_2$ or Si$_3$N$_4$ | Mono SiC or poly SiC or poly AlN or sapphire or poly GaN | AlN or GaN or poly SiC or diamond or boron nitride or metal |
| GaN or AlN or AlGaN or GaInN or SiC | Mono SiC or {111} Si or sapphire + etching GaN or NdGaO$_2$ or LiGaO$_3$ | SiO$_2$ or Si$_3$N$_4$ | Mono SiC or poly SiC or poly AlN or sapphire or poly GaN | AlN or GaN or poly SiC or diamond or boron nitride or metal |
| +etching a portion of the GaN or the AlN or the AlGaN or the GaInN or the SiC | Mono SiC or {111} Si or sapphire + etching GaN or NdGaO$_2$ or LiGaO$_3$ | SiO$_2$ or Si$_3$N$_4$ | Mono SiC or poly SiC or poly AlN or sapphire or poly GaN | Poly SiC or diamond or boron nitride or metal |

EXAMPLE 7

In this example (first row of Table 4), a structure is made comprising a monocrystalline silicon carbide seed layer 2 on a monocrystalline silicon carbide support 12 with silicon oxide bonding layers 10 and 11 between them, in the same manner as that described above for Example 1. Thereafter, a working layer 16 of monocrystalline gallium nitride is made on the free surface of the silicon carbide seed layer 2 by MOCVD. The structure obtained in this way is then subjected to treatment suitable for separating the structure constituted by the seed layer 2 and the working layer 16 from the support 12. This provides firstly a structure constituted by a gallium nitride working layer 16 covered in a seed layer 2 of monocrystalline silicon carbide, and a support 12 that is ready for recycling. A thick layer 4 of polycrystalline silicon carbide is then deposited by CVD on the seed layer 2.

The monocrystalline silicon carbide support 12 is relatively expensive, but in the present example it is recycled when implementing the method of the invention on a subsequent occasion.

EXAMPLE 8

In another example (second row of Table 4) of this third implementation of the method of the invention, the same structure is made as in Example 7, but the seed layer 2 of monocrystalline silicon carbide is withdrawn, e.g. by plasma etching, prior to forming the thick layer 4 of polycrystalline silicon carbide.

EXAMPLE 9

In yet another example of the method of the invention (third row of Table 4), a structure is made as in Example 8, except that not only is the seed layer 2 of monocrystalline silicon carbide removed, but so also is a portion of the working layer 16 of gallium nitride so as to conserve a working layer 16 that presents as few defects as possible.

The seed layer 2 of monocrystalline silicon carbide or the working layer 16 of monocrystalline gallium nitride can be subjected to various additional technological steps prior to being subjected to deposition of the thick layer 4, these steps seeking to provide some or all of the electronic components, or comprising making uniform deposits of additional films, either epitaxially or otherwise.

The polarity of the seed layer 2 of monocrystalline silicon carbide (Si face or C face) and the polarity of the working layer 16 of gallium nitride can be determined by the polarity selected for the initial source substrate 6. The method of the invention optionally includes at least one double transfer enabling polarity to be changed twice over.

Similarly, these examples can be transposed to situations in which, in accordance with the invention, a working layer 16 is made of aluminum nitride, of silicon carbide, of aluminum and gallium alloy, of indium and gallium alloy, or of some other compound, instead of making the working layer 16 out of gallium nitride as described above. The gallium nitride working layer 16 can also be a multilayer structure comprising a stack of layers of the gallium nitride, aluminum nitride, etc. types, optionally with different kinds of doping, etc.

The seed layer 2 can be made of {111} silicon or of sapphire or of neodymium gallate, or of indium gallate, etc. instead of being made of monocrystalline silicon carbide.

The support 12 can be made of polycrystalline silicon carbide or of polycrystalline silicon nitride or of polycrystalline aluminum nitride or of sapphire or of polycrystalline gallium nitride, instead of being made of monocrystalline silicon carbide. The thick layer 4 can be made of polycrystalline aluminum nitride, of diamond, or of boron nitride, instead of being made of polycrystalline silicon carbide.

In yet another embodiment of the method of the invention, a structure is made as in the above examples, except that no intermediate layers or bonding layers 10 and 11 are made. For example, a seed layer 2 is taken from a source substrate 6 of {111} silicon, and is assembled with a polycrystalline silicon carbide support 12 by direct adhesion (e.g. as described in the preceding implementations). Thereafter, one of the techniques mentioned above is used to deposit a working layer 16 of gallium nitride on the seed layer 2.

Numerous other variants to the above-described embodiments can also be envisaged without going beyond the ambit of the invention. For example, the operations described in different examples of the implementations of the method of the invention can be combined with one another.

As shown in FIG. 4, one variant consists in performing batch treatment on the seed layers 2 prior to depositing the working layer 16. Under such circumstances, the seed layers 2 are fixed on a common support 12 of large size.

Additionally, the shape of this common support 12 can be arbitrary (circular, rectangular, etc.).

Under these circumstances, the seed layers 2 can be identical or they can be different. Each of the seed layers 2 can be subjected to a separate operation of detaching the seed layer from the support 12. By way of example, the common support 12 can be a plate of polycrystalline silicon carbide covered in an oxide of silicon.

Advantageously, a stiffening substrate may be bonded to the working layer 16 of each of the various assemblies prior to the operation to detach the working layer assembly 16 on the seed layers 2 from the support 12.

Each common support 12 is recycled.

Also in accordance with the invention, the parameters governing deposition of the thick layer 4 are optimized so as to make a thick layer 4 that is monocrystalline. Even if the monocrystalline thick layer 4 is not of best quality, its quality can nevertheless be sufficient in numerous applications, whenever very high crystal quality is required only for the working layer 16.

The method of the invention is particularly advantageous when single crystals cannot be grown (as is the case of gallium nitride) or when they are difficult to grow (as is the case for silicon carbide).

The aforementioned description of the invention may be transposed to growing a working layer out of other semiconductor materials, such as indium phosphide, gallium arsenide, germanium, silicon-germanium, etc., or indeed other materials such as lithium niobate.

What is claimed is:

1. A method for fabricating a substrate for optics, electronics, or opto-electronics, which method comprises:
   implanting atomic species into a face of a source substrate to form a weakened zone therein corresponding to the depth of penetration of the atomic species;
   transferring a seed layer on to a support substrate by bonding a face of the support substrate to the face of the source substrate and detaching the seed layer from the source substrate;
   depositing a working layer on the seed layer by chemical vapor deposition, high temperature chemical vapor deposition, hydride vapor phase epitaxy, epitaxy, metal organic chemical vapor deposition, or molecular beam epitaxy to form a composite substrate comprising the support substrate, seed layer and working layer; and
   removing the seed layer and the working layer from the support substrate to form a substrate.

2. The method of claim 1, wherein material between the face of the source substrate and the weakened zone defines the seed layer.

3. The method of claim 2, wherein the seed layer is adhered to the support substrate by molecular adhesion in an adhesion interface.

4. The method of claim 3, which further comprises detaching the seed layer and the working layer from the composite substrate by the application of stress at the adhesion interface, wherein the stress is selected from the group consisting of mechanical stress, thermal stress, chemical etching, electrostatic stress and laser irradiation stress, or any combination thereof.

5. The method of claim 1 wherein the seed layer comprises a material from the group consisting of sapphire, silicon carbide, zinc oxide, silicon, gallium nitride, neodymium gallate, and lithium gallate, and the working layer is gallium nitride.

6. The method of claim 5, wherein the support substrate comprises a material from the group consisting of silicon carbide, aluminum nitride, silicon, and sapphire.

7. The method of claim 6, wherein the seed layer and the support substrate have substantially the same composition.

8. The method of claim 1, which further comprises preparing the seed layer to receive the working layer by polishing, annealing, smoothing, oxidation, or etching.

9. The method of claim 1, which further comprises applying at least one intermediate layer between the seed layer and the support substrate.

10. The method of claim 9, wherein the intermediate layer is a bonding layer or an insulating layer.

11. The method of claim 10, wherein the support substrate is polycrystalline SiC, monocrystalline SiC, sapphire, polycrystalline AlN or polycrystalline GaN, the seed layer is Si, monocrystalline SiC, sapphire, monocrystalline GaN, NdGaO$_2$, or LaGaO$_2$, the at least one bonding layer is SiO$_2$ or Si$_3$N$_4$, and the working layer is GaN, AlN, AlGaN, GaInN, or SiC.

12. The method of claim 9, wherein one intermediate layer is present upon the seed layer prior to transfer and forms the face of the source substrate that is bonded to the support substrate.

13. The method of claim 12, wherein another intermediate layer forms the face of the support substrate that is bonded to the face of the source substrate.

14. The method of claim 1 which further comprises applying a further layer upon the working layer on a face opposite that of the seed layer.

15. The method of claim 14, wherein the further layer is applied upon the working layer prior to detachment of the seed layer and the working layer from the support substrate.

16. The method of claim 1 which results in the formation of a substrate which comprises: a seed layer of Si, monocrystalline SiC, sapphire, monocrystalline GaN, NdGaO$_2$, or LaGaO$_2$, a bonding layer of SiO$_2$ or Si$_3$N$_4$ on the seed layer, and a working layer of GaN, AlN, AlGaN, GaInN, or SiC on the seed layer.

17. The method of claim 16 wherein the substrate that is formed further comprises a further layer upon the working layer on a face opposite that of the seed layer.

18. The method of claim 17, wherein the further layer is polycrystalline SiC, polycrystalline AlN, polycrystalline GaN, boron nitride, diamond or a metal.

19. The method of claim 1, which further comprises removing the support substrate such that it remains in a condition sufficient for recycling and reuse.

20. The method of claim 1, which further comprises removing the support substrate by etching or by mechanical or chemical removal.

21. A method for fabricating a substrate for optics, electronics, or opto-electronics, which method comprises:
implanting atomic species into a face of a source substrate to form a weakened zone therein corresponding to the depth of penetration of the atomic species;
transferring a seed layer on to a support substrate by bonding a face of the support substrate to the face of the source substrate and detaching the seed layer from the source substrate;
depositing a working layer on the seed layer to form a composite substrate comprising the support substrate, seed layer and working layer; and
detaching the seed layer and the working layer from the support substrate to form a substrate;
wherein the support substrate comprises a material having a thermal expansion coefficient of about 0.7 to 3 times the thermal expansion coefficient of the working layer, and the seed layer includes a crystal lattice parameter sufficient for the epitaxial growth of the working layer onto the seed layer such that the working layer has a dislocation concentration of less than about 10$^7$/cm$^2$.

22. A method for fabricating a substrate for optics, electronics, or opto-electronics, which method comprises:
implanting atomic species into a face of a source substrate to form a weakened zone therein corresponding to the depth of penetration of the atomic species;
transferring a seed layer on to a support substrate by bonding a face of the support substrate to the face of the source substrate and detaching the seed layer from the source substrate;
depositing a working layer on the seed layer to form a composite substrate comprising the support substrate, seed layer and working layer;
detaching the seed layer and the working layer from the support substrate to form a substrate; and
applying a further layer of polycrystalline SiC, polycrystalline AlN, polycrystalline GaN, boron nitride, diamond or a metal upon the working layer on a face opposite that of the seed layer.

* * * * *

UNITED STATES PATENT AND TRADEMARK OFFICE
CERTIFICATE OF CORRECTION

| | |
|---|---|
| PATENT NO. | : 7,235,462 B2 |
| APPLICATION NO. | : 10/922997 |
| DATED | : June 26, 2007 |
| INVENTOR(S) | : Letertre et al. |

It is certified that error appears in the above-identified patent and that said Letters Patent is hereby corrected as shown below:

<u>Title Page</u>:
Item (63), after "May 27, 2003," insert -- now Pat. No. 6,794,276 --; and after "Nov. 26," change "2000" to -- 2001 --. Item (63) will then correctly appear as:

-- (63)  Continuation of application No. 10/446,605, filed on May 27, 2003, now Pat. No. 6,794,276, which is a continuation of application No. PCT/FR01/03714, filed on November 26, 2001. --

Signed and Sealed this

Twenty-eighth Day of August, 2007

JON W. DUDAS
*Director of the United States Patent and Trademark Office*